(12) United States Patent
Hack et al.

(10) Patent No.: US 9,343,695 B2
(45) Date of Patent: May 17, 2016

(54) METHOD OF FABRICATING ORGANIC LIGHT EMITTING DEVICE (OLED) PANEL OF ARBITRARY SHAPE

(71) Applicant: Universal Display Corporation, Ewing, NJ (US)

(72) Inventors: Michael Hack, Princeton, NJ (US); Ruiqing Ma, Morristown, NJ (US); Emory Krall, Philadelphia, PA (US); William E. Quinn, Whitehouse Station, NJ (US)

(73) Assignee: UNIVERSAL DISPLAY CORPORATION, Ewing, NJ (US)

( * ) Notice: Subject to any disclaimer, the term of this patent is extended or adjusted under 35 U.S.C. 154(b) by 0 days.

(21) Appl. No.: 14/458,275

(22) Filed: Aug. 13, 2014

(65) Prior Publication Data

US 2016/0049608 A1 Feb. 18, 2016

(51) Int. Cl.
*H01L 21/00* (2006.01)
*H01L 51/52* (2006.01)
*H01L 51/56* (2006.01)
*H01L 27/32* (2006.01)

(52) U.S. Cl.
CPC ........ *H01L 51/5237* (2013.01); *H01L 27/3202* (2013.01); *H01L 27/3204* (2013.01); *H01L 51/5206* (2013.01); *H01L 51/5221* (2013.01); *H01L 51/5246* (2013.01); *H01L 51/56* (2013.01); *H01L 2251/53* (2013.01); *H01L 2251/566* (2013.01)

(58) Field of Classification Search
CPC ............... H01L 21/02521; H01L 21/02546; H01L 21/02579; H01L 21/0262; H01L 21/02642; H01L 21/02647; H01L 33/007; H01L 33/641; H01L 21/0237; H01L 21/0242; H01L 21/02458; H01L 33/36; H01L 33/64; H01L 21/0254; H01L 27/3202; H01L 27/3204
USPC ............................ 257/40, 43, 89, 98; 438/48
See application file for complete search history.

(56) References Cited

U.S. PATENT DOCUMENTS

| | | | |
|---|---|---|---|
| 4,769,292 | A | 9/1988 | Tang et al. |
| 5,247,190 | A | 9/1993 | Friend et al. |
| 5,703,436 | A | 12/1997 | Forrest et al. |
| 5,707,745 | A | 1/1998 | Forrest et al. |
| 5,834,893 | A | 11/1998 | Bulovic et al. |
| 5,844,363 | A | 12/1998 | Gu et al. |

(Continued)

FOREIGN PATENT DOCUMENTS

| | | |
|---|---|---|
| WO | 2008057394 | 5/2008 |
| WO | 2010011390 | 1/2010 |
| WO | 2014132322 | 9/2014 |

OTHER PUBLICATIONS

Baldo, et al., "Highly efficient phosphorescent emission from organic electroluminescent devices", Nature, vol. 395, pp. 151-154, 1998.

(Continued)

*Primary Examiner* — Dung Le
(74) *Attorney, Agent, or Firm* — Morris & Kamlay LLP (57) ABSTRACT

OLED panels and techniques for fabricating OLED panels are provided. Multiple cuts may be made in an OLED panel to define a desired shape, as well as the location and shape of external electrical contacts. The panel may be encapsulated before or after being cut to a desired shape, allowing for greater flexibility and efficiency during manufacture.

17 Claims, 7 Drawing Sheets

(56) References Cited

U.S. PATENT DOCUMENTS

| | | |
|---|---|---|
| 6,013,982 A | 1/2000 | Thompson et al. |
| 6,087,196 A | 7/2000 | Sturm et al. |
| 6,091,195 A | 7/2000 | Forrest et al. |
| 6,097,147 A | 8/2000 | Baldo et al. |
| 6,294,398 B1 | 9/2001 | Kim et al. |
| 6,303,238 B1 | 10/2001 | Thompson et al. |
| 6,337,102 B1 | 1/2002 | Forrest et al. |
| 6,468,819 B1 | 10/2002 | Kim et al. |
| 6,664,730 B2 | 12/2003 | Weaver |
| 6,835,950 B2 | 12/2004 | Brown et al. |
| 7,279,704 B2 | 10/2007 | Walters et al. |
| 7,431,968 B1 | 10/2008 | Shtein et al. |
| 7,968,146 B2 | 6/2011 | Wagner et al. |
| 2003/0230980 A1 | 12/2003 | Forrest et al. |
| 2004/0174116 A1 | 9/2004 | Lu et al. |
| 2012/0181933 A1 | 7/2012 | Ma et al. |
| 2012/0286298 A1 | 11/2012 | Pang et al. |
| 2014/0097429 A1* | 4/2014 | Kim .............. H01L 27/1262 257/48 |

OTHER PUBLICATIONS

Baldo, et al., "Very high-efficiency green organic light-emitting devices based on electrophosphorescence", Applied Physics Letters, vol. 75, No. 1, pp. 4-6, Jul. 5, 1999.

\* cited by examiner

METHOD OF FABRICATING ORGANIC LIGHT EMITTING DEVICE (OLED) PANEL OF ARBITRARY SHAPE

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices (OLEDs) and, more specifically, to techniques for fabricating an OLED panel having an arbitrary shape and panels made by such techniques.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known in the art.

One example of a green emissive molecule is tris(2-phenylpyridine) iridium, denoted $Ir(ppy)_3$, which has the following structure:

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

In an embodiment of the invention, a method of fabricating an organic light emitting device (OLED) panel having an arbitrary shape is provided. The method may include obtaining a first OLED panel having a plurality of layers, including a substrate, an anode, a cathode, and an emissive organic stack. A first cut may be made in the first OLED panel on a first shape outline, which does not extend through at least one layer of the first OLED panel. A second cut or etch may be made in the first OLED panel, which extends through each of the plurality of layers of the first OLED panel. The OLED panel may be encapsulated, such as with a thin film encapsulation, prior or subsequent to one or both of the cuts. The first and second cuts may be made in any order, and may be made partially or entirely concurrently. One or both of the cuts may form externally-accessible electrical connections for the OLED panel. The method may be repeated for multiple OLED panels, which may share a common substrate and/or a substrate barrier layer.

In an embodiment, an OLED panel may include a cathode having a central first region and a second region adjacent to an exterior edge of the OLED, which is separated from the first region by an ablated cathode region. An anode of the OLED panel may be electrically connected to the second region.

In an embodiment, an OLED panel may be fabricated by obtaining an OLED blank without defined external electrical connections and having a first shape. The OLED blank may be cut to a second shape different than the first shape to form an OLED panel having the second shape. The process of cutting the OLED panel to the second shape may define a plurality of external electrical connections for the OLED panel, such as for the anode and/or the cathode.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
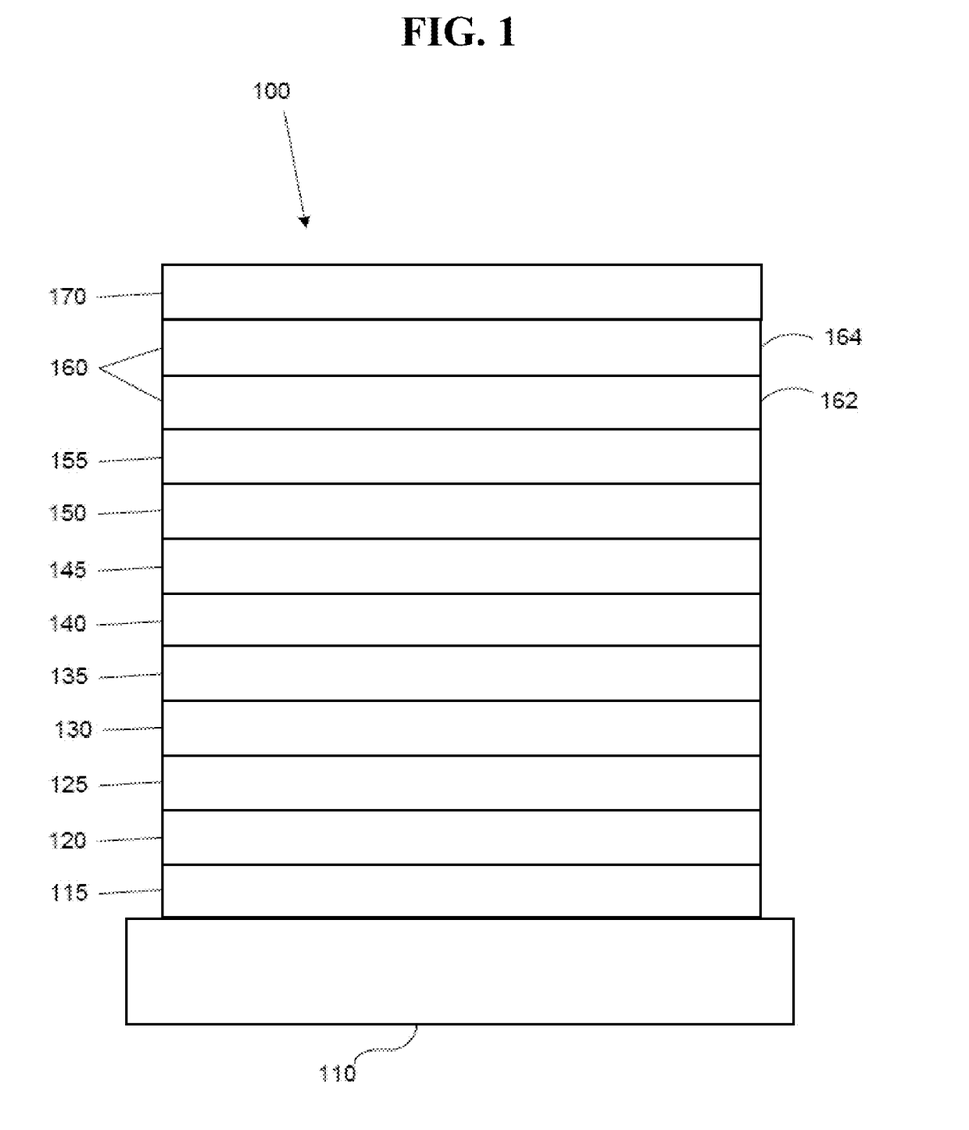
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
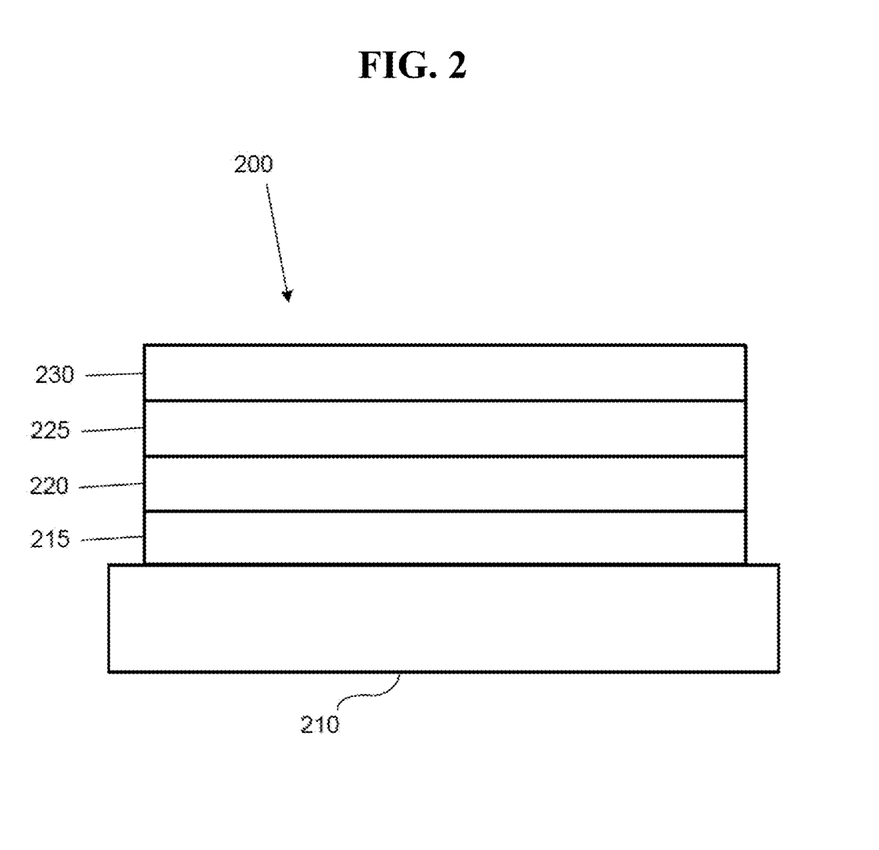
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention may be incorporated into a wide variety of consumer products, including flat panel displays, computer monitors, medical monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

OLED lighting panels are often made on glass, and are made to a specific design and size. Thin film encapsulation techniques may allow for rigid and flexible panels to be made, that can withstand various environments and uses. Examples of general thin film encapsulation techniques are described, for example, in U.S. Pat. No. 6,835,950, the disclosure of which is incorporated by reference in its entirety.

As disclosed herein, thin film encapsulation techniques may be used to produce panels of arbitrary shapes, such that each panel produced in a fabrication system or process can have a unique shape, thus allowing for custom manufacturing within a single manufacturing line. More specifically, as described in further detail herein, the shape of each panel may be customized after the panel has been substantially or entirely fabricated, for example, after the deposition of the anode, the emissive organic stack, and the cathode layers of the panel. Thus, for example, embodiments of the invention may allow for a fabrication or manufacturing line, such as a roll-to-roll or batch system, that allows each panel to have a unique shape. To reduce costs and complexity, much of the manufacturing process may be common for all panels, with the shape customization introduced near the end of the production process. Fabricated panels may then be thin film encapsulated. The shape of the panel may be customized, such as by laser cutting, before or after encapsulation.

Generally, embodiments of the present invention may include obtaining a first OLED panel having multiple layers, including a substrate, an anode, a cathode, and an emissive organic stack. The emissive organic stack may include one or more emissive layers as well as the various transport, blocking, and other layers previously disclosed with respect to FIGS. 1 and 2. A first cut may be made in the OLED panel along a shape outline to form the panel into a desired outline shape. The first cut may extend through only a portion of the layers of the OLED panel. For example, if a circular, hexagonal, or other shape is desired for the OLED panel, the cut may be made along a shape outline in a circular, hexagonal, or other shape. As used herein, the shape outline is described as a shape lying in a plane parallel to the layers of the OLED, i.e., parallel to the substrate, anode, and/or cathode of the OLED panel. A second cut also may be made in the OLED panel, which extends through all the layers of the OLED panel. This double cut approach has the benefit of producing a panel of arbitrary shape without shorting the anode to cathode as may occur if only a single cut is used. The purpose of the cut only extending through a portion of the OLED layers is to electrically isolate the cathode in the region where the panel is cut through all the layers of the panel.

In an embodiment, the first and/or second cuts in the OLED panel may be made using laser ablation, water jet cutting, plasma cutting, CNC, EDM, and the like, though in some cases techniques other than laser ablation and the like may be too destructive for very thin plastic substrates. Thus, in some embodiments, laser cutting processes such as laser ablation may be preferred. Relative to other methods, laser ablation is a non-contact technique which causes little or no damage to the organic devices. Laser ablation may be especially effective in removing metals, since metal strongly absorb laser energy. The difference in energy absorption behavior between organics, oxides and metal materials can be explored to optimize the process condition. $CO_2$ or Nd:YAG pulsed lasers can be used to remove cathode material. Further, laser power and wavelength can be changed to control etch depth and provide material selectivity.

Other methods may be used to remove cathode material as disclosed herein. For example, etching is a standard semiconductor process. Since wet solutions typically cannot be used on completed OLEDs, dry etching techniques may be applied. However, dry etch involves highly reactive chemicals and high energy plasmas, which may damage some OLED devices.

Laser cutting techniques also may be used to cut through a substrate. Under laser irritation, many common substrate materials melt, burn, or vaporize, resulting a clean cut. Other cutting processes also may be used to cut through a substrate. For example, a mechanical blade or knife, such as the Graphtec FC4500 flatbed cutter, may be used to cut the substrate. Such techniques may have an advantage in causing little or no debris. As another example, roll-feed cutting plotters could also be used, such as those made by Graphec, Roland, and other manufacturers. In a roll-to-roll process, slitting is a standard cutting techniques and has been used extensively. If metal substrates such as steel are used, plasma cutting may be used, and may be particularly suited for cutting thick metals.

Advantages of laser cutting over mechanical cutting include easier workholding and reduced contamination of the workpiece, since there is no cutting edge which can become contaminated by the material or contaminate the material. The precision available with laser cutting techniques may be higher and/or more consistent, since the laser beam does not wear during the process. There is also a reduced chance of warping the material that is being cut, as laser systems have a small heat-affected zone. Some materials are also very difficult or impossible to cut by more traditional means.

As disclosed herein, various cutting techniques and systems may be arranged in a cutting system that can make cuts of arbitrary shape within a plane parallel to a substrate, i.e., to cut arbitrary shapes into the substrate. In some embodiments, such systems also may be equipped with dispensing syringes for edge encapsulation and/or forming metal contacts using metal ink as disclosed herein. Such systems also may be equipped with wire bonding equipment to contact electrodes.

Figure 3:
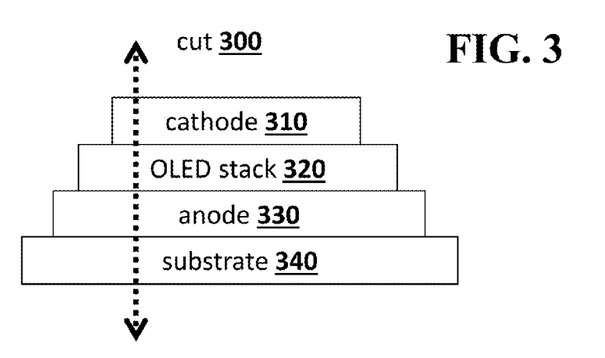
FIG. 3 shows an example schematic illustration of an OLED panel and a cut according to an embodiment of the invention.

Typically, the first and second cuts may be made subsequent to deposition of the cathode, such that the OLED structure includes a substrate, an anode and any suitable buslines, the organic stack, and the cathode. An example schematic illustration of such a structure is shown in FIG. 3. As shown, the basic structure of the OLED prior to cutting may include a cathode 310, an OLED stack 320 that may include one or more organic emissive layers and other layers as described with respect to FIGS. 1 and 2, an anode layer 330 that may include various buslines, and a substrate 340. A cut 300 may be made through the OLED panel to obtain a desired shape of the OLED panel. Although the cut 300 is shown extending along a line through each layer of the panel in FIG. 3, as described in further detail below, one or more cuts may extend only through a portion of the OLED layers.

Figure 4:
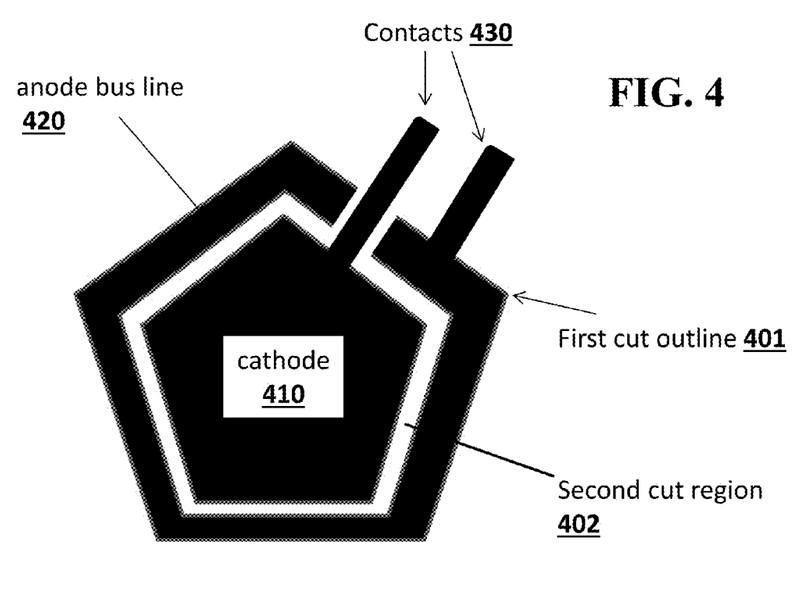
FIG. 4 shows a top schematic view of an OLED panel having an arbitrary shape according to an embodiment of the invention.
Figure 5A:
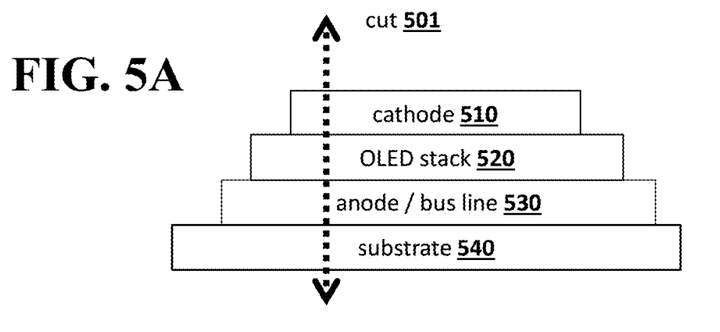
FIG. 5A shows a cutting line to achieve a desired shape for an OLED panel according to an embodiment of the invention.
Figure 5B:
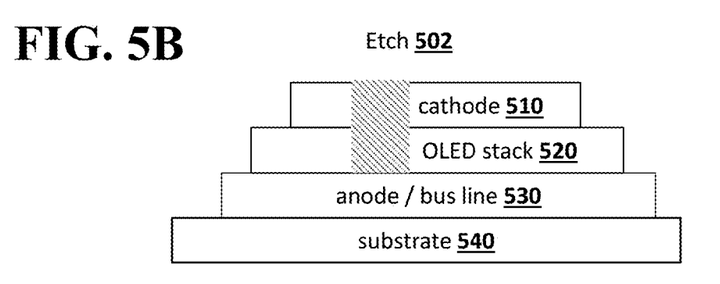
FIG. 5B shows a cut that extends through the cathode and the OLED stack according to an embodiment of the invention.

Because the anode and cathode are electrically conductive, a cut made through the device that extends between the anode and the cathode is likely to cause a short between the two layers. This short can be exploited to provide a relatively low resistance anode bus ring. That is, the shorts will connect the anode to the ring of metal around the desired shape as shown in FIG. 4. This ring of metal can be electrically isolated from the cathode by a second cut that removes cathode material from a region between the anode bus ring and the central portion of the cathode. An example of such a configuration is illustrated in FIG. 5B.

FIG. 4 shows a top view of an example of an OLED panel having a shape and anode ring defined by two such cuts. In FIG. 4, filled regions represent material of the OLED panel, such as metal or other conductive material of the anode and cathode, and white regions represent an absence of material in at least some layers of the OLED panel. A first cut may be made through all the layers of the OLED panel to obtain the desired shape of the final panel. In FIG. 4, the example shape is a pentagon and external connections. It will be apparent to one of skill in the art that any desired shape may be constructed in a similar manner. For example, an OLED panel "blank" may be obtained that has a conventional rectangular shape. Cuts as disclosed herein may then be made through various layers of the blank to obtain the desired shape, such as that shown in FIG. 4. A first cut may follow the desired shape outline 401. This first cut may be made through all the layers of the panel. A second cut 402 may be made through only a portion of the layers of the OLED panel, including the cathode layer. Thus cut may remove cathode material from the white region 402 shown in FIG. 4 to isolate the central cathode 410 from an outer relatively low-resistance anode busline 420. Notably, the "second" cut may be made prior to or concurrently with the "first" cut, which may allow for flexibility in manufacturing processes. For example, multiple fabrication heads may be used to perform the first and second cuts, and each head may operate partially or entirely at the same time as the other.

The shape of the cuts 401, 402 may be designed to create or allow for external contact connections 430. An external connection to the inner cathode region 410 may be made as shown, for example, by laser depositing metal or other conductor, or depositing a metal ink from the cathode region 410 to a pad that can be externally accessed. As used herein, an "external" connection refers to one that extends out of the device beyond the basic shape of the OLED panel, while providing an electrical connection to a portion of the device within the panel. For example, the contacts 430 in FIG. 4 extend beyond the basic pentagon shape of the panel, while providing electrical connection to the anode busline 420 and cathode 410 that are within the outer shape outline of the panel. Thus, externally-accessible electrical connections 430 may be formed as a result of the first and/or second cut. In contrast, conventional OLED panel fabrication techniques require the location, shape, and size of any external electrical connections to be selected prior to some or all of the fabrication process, leaving little room for customization of the OLED panel configuration.

A minimum distance may be maintained between the first and second cuts, for example, to allow the anode and cathode portions to remain electrically isolated. Referring to FIG. 4, the inner cathode region 410 may thus remain isolated from the outer anode busline 420. As a specific example, the minimum distance between the cuts may be at least 100 µm.

A process as described with respect to FIG. 4 may be used to fabricate an OLED panel of arbitrary shape, which has a divided cathode as shown. More generally, in an embodiment an OLED panel may include a cathode having multiple regions. For example, the cathode may have a central region such as the cathode 410 in FIG. 4, and an outer region that is closer to, or adjacent to, and exterior edge of the OLED as shown in FIG. 4. As previously described, the outer region also may be electrically connected to the anode of the OLED panel. The two regions may be separated by a region from which cathode material has been removed, such as by ablation, as described previously with respect to the second cut shown in FIG. 4.

As described in further detail herein, an OLED panel may be thin film encapsulated before or after one or both cuts are made in the panel. If the panel is thin film encapsulated before cutting, the thin film encapsulation may need to be removed from the cathode to make a connection. Laser ablation or any other suitable technique may be used to remove the encapsulation layer. For example, a lower laser power or different wavelength than would be used for deep trenching or cutting may be used to remove the encapsulation.

Alternatively or in addition, if the panel is cut before it is encapsulated, one or more external electrical contacts may be formed and encapsulated using a process as shown in FIG. 5. In some embodiments, the cutting and encapsulation process may be performed in an oxygen- and moisture-free atmosphere. FIG. 5A shows a cutting line 501 to achieve a desired shape as previously described, which extends through the entire OLED panel including the cathode 510, OLED stack 520, anode and buslines 530, and the substrate 540. FIG. 5B shows a cut 502 that extends through the cathode and the OLED stack. Such a cut may be referred to as an "etch" or an "isolation etch," because it does not extend entirely through the panel, and because it separates the anode and cathode contact areas as previously described with respect to FIG. 4.

Figure 5C:
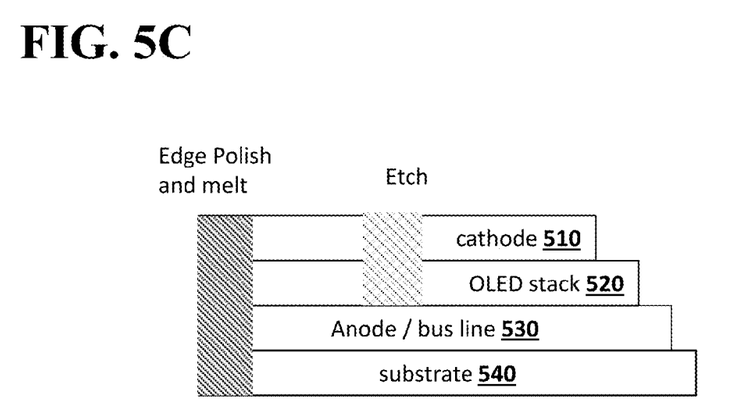
FIG. 5C shows an OLED panel with a finished full thickness edge according to an embodiment of the invention.
Figure 5D:
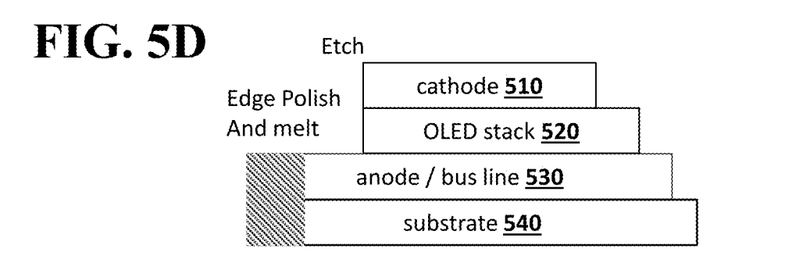
FIG. 5D shows an edge polish at the anode level according to an embodiment of the invention.

In an embodiment, edges of the device may be finished, such as by melting and/or polishing. FIGS. 5C and 5D show two variations of edge melting and polishing. In FIG. 5C, a full thickness edge may be finished, such as by melting and/or polishing all layers in the panel. FIG. 5D shows an edge polish at the anode level after removing the cathode and organic layers, via the isolation etch shown in FIG. 5B.

Figure 5E:
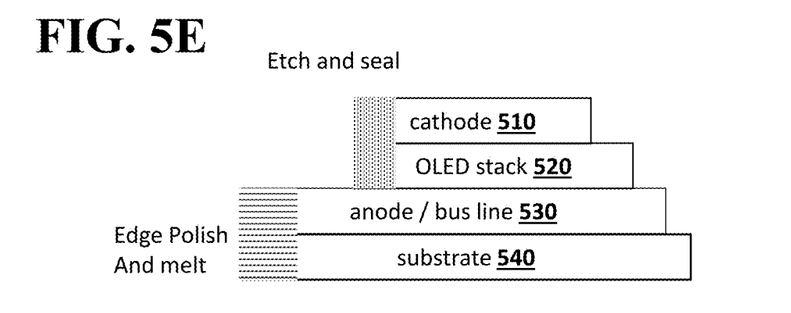
FIG. 5E shows an OLED panel in which an edge of an isolation etch also is finished according to an embodiment of the invention.

In an embodiment, the edge of the isolation etch also may be sealed or otherwise finished, as shown in FIG. 5E. The seal may encapsulate the edge of the panel, for example to prevent oxygen and moisture from degrading the panel. Examples of techniques to deposit an edge seal include thin film encapsulation processes as disclosed herein and as known in the art, jetting of metal ink over the exposed surface, jetting a liquid along the edge of the etched cathode region, and the like. The seal may extend laterally to cover a cut through the substrate as well.

Figure 5F:
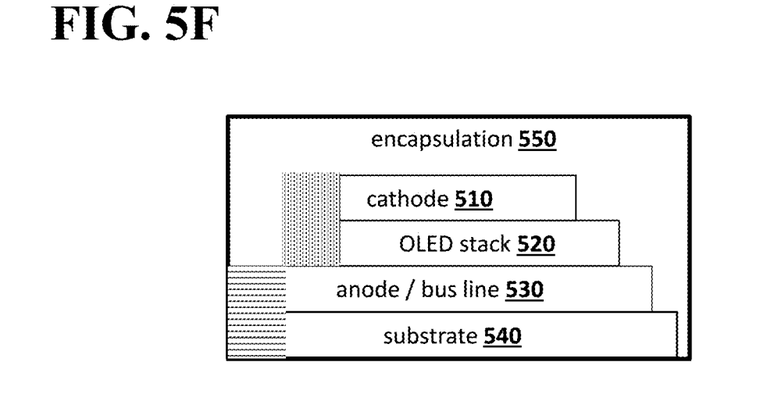
FIG. 5F shows an example device with an encapsulation according to an embodiment of the invention.

In an embodiment, an encapsulation, such as a thin film encapsulation layer, may be applied to the device. FIG. 5F shows an example device with an encapsulation 550. As previously described, the encapsulation 550 also may be applied before the cuts 501, 502 are made, after which the edge finishes and/or additional edge encapsulation may be applied. Examples of such a process are described in further detail with respect to FIG. 7.

For clarity of illustration, FIGS. 5A-5F do not show external electrical contacts for the cathode and anode layers. However, as previously described, such contacts may be present and/or may be formed by the cuts 501, 502.

Figure 6:
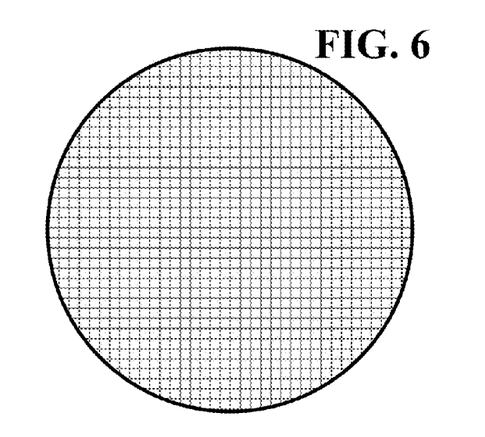
FIG. 6 shows an example busline arrangement according to an embodiment of the invention.

In an embodiment, the anode layer 530 may include buslines. It may be preferred for such buslines to be two-dimensional, i.e., extending within a plane parallel to the anode. It also may be preferred for the buslines to be orthogonal, as shown in FIG. 6. Such an arrangement may be more likely to provide adequate current conduction after cuts such as those shown in FIG. 5 are performed. Examples of techniques for fabricating and arranging buslines are disclosed in US Patent Pub. No. 2012/0286298, the disclosure of which is incorporated by reference in its entirety. Ensuring appropriate busline design for panels of arbitrary shape It may be preferred to use buslines and/or a bus grid as disclosed herein to prevent undesirable electrical losses and avoid unnecessary current drops. In conventional panels having a pre-determined shape, the bus grid often is designed to match the panel dimensions. In embodiments disclosed herein, in which the final panel shape may not be determined at the point that the anode and/or buslines are deposited, it may be desirable for the anode grid to have relatively narrow spacing so that any arbitrary cut does not lead to unacceptable resistive losses. As an example, this may be accomplished by using a sub-grid having a relatively small pitch, with thin conductive lines, and a lower-resistance, coarser grid with thicker conductive lines. As a specific example, a sub-grid having a pitch of about 1-2 mm and conductive lines about 50-100 μm thick may be used in conjunction with a grid having a pitch of about 1-3 cm and conductive lines about 1-3 mm thick. In an embodiment, each small defined region of the grid may contain a fuse to allow for relatively simple separation of the desired final OLED panel shape from the remainder of the original OLED blank from which it is cut without unacceptable losses.

FIG. 7 shows examples of techniques for fabricating a panel as disclosed herein where the panel is cut subsequent to encapsulation, such as with a thin film encapsulation. FIG. 7A shows an example OLED panel including a cathode 710, OLED stack 720, anode and busline layer 730, and substrate 740, with an encapsulation 750. As previously described, the panel may be cut along to achieve a desired shape, via a cut 701. FIG. 7B shows an example of a cut made through the OLED panel including the encapsulation 750. Because the encapsulation 750 is applied prior to performing the cut 701 in this example, if the panel is cut after it is thin film encapsulated then the device edge and cathode isolation etch will be exposed. If left in this state, the device may be vulnerable to the ingress of oxygen and water towards the active area of the device. In an embodiment, an edge seal may be fabricated by placing a metal over the device edge. For example, a metal ink such as JS-B30G from Novacentrix in Texas, may be ejected onto the edge and then formed as the solvent evaporates. Alternatively or in addition, a laser may be applied to the edge to heat the deposited metal so as to provide improved metal coverage. Other techniques may be used if a non-conducting barrier is needed. For example, a curable polymer gel may be applied to the cut areas by jetting, syringe dispensing, or any other suitable deposition technique. The gel may be subsequently UV, laser, or thermally cured to achieve a desired seal.

Figure 7A:
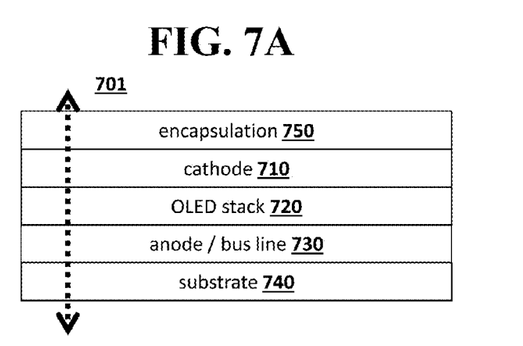
FIG. 7A shows an example OLED panel cut line having an arbitrary shape according to an embodiment of the invention.
Figure 7B:
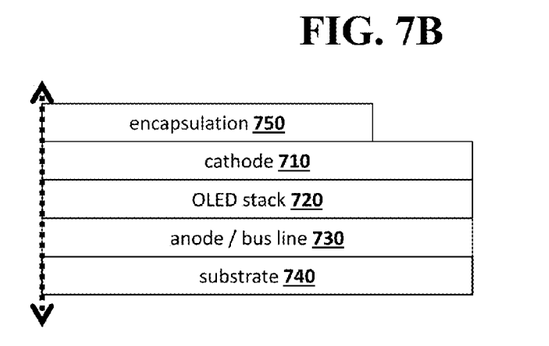
FIG. 7B shows an example of a cut made through an encapsulated OLED panel to expose the cathode.
Figure 7C:
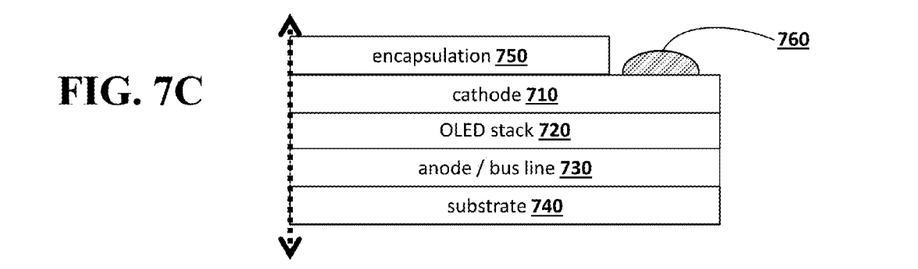
FIG. 7C shows an example OLED panel after a cut according to an embodiment of the invention with cathode contact.
Figure 7D:
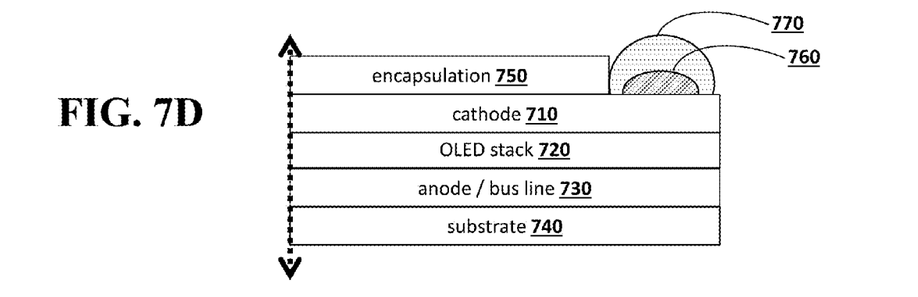
FIG. 7D shows an example of an OLED panel with a bonded contact according to an embodiment of the invention with bond metal encapsulated.
Figure 7E:
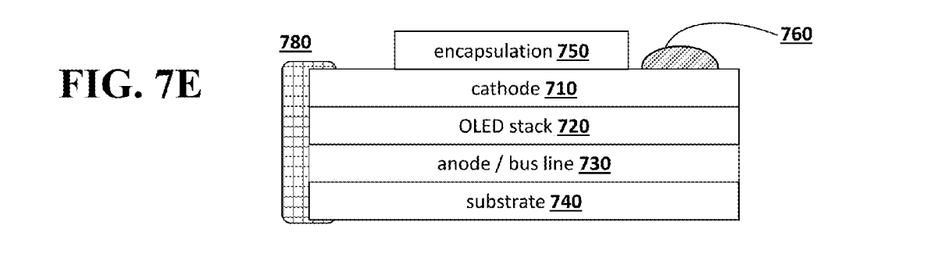
FIG. 7E shows an example of a device including an edge-type contact according to an embodiment of the invention.
Figure 7F:
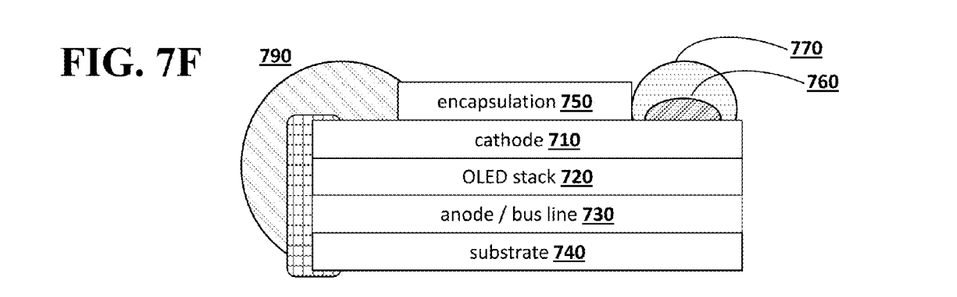
FIG. 7F shows an example device including an additional encapsulation according to an embodiment of the invention.

In some embodiments, additional encapsulation may be applied after FIG. 7C shows an example panel after the cut 701 has been performed, with a metal contact 760 deposited on the cathode 710. FIG. 7D shows the bonded contact 760 after encapsulation with a curable encapsulant 770, such as a polymer or liquid encapsulation material. FIG. 7E shows an example of a device including melted edge-type contact 780 as previously described. FIG. 7F shows a device including an additional encapsulation 790, resulting in a bonded and encapsulated anode contact and edge seal. Examples of edge seal materials include organic or organo-silicon polymers that can be UV cured. As previously described with respect to FIG. 5, the panels described with respect to FIG. 7 also may include various buslines such as a busline grid.

Techniques in which the cuts disclosed herein are performed subsequent to encapsulation may be advantageous to simplify manufacturing processes. For example, if the cuts were performed via laser scribing prior to encapsulation, the cutting process likely would need to be conducted in vacuum with the device passing directly into the laser scribe chamber after cathode deposition. The advantage of this approach is that the thin film encapsulation could seal the edge of the device after laser scribe.

In contrast, if the panel is cut after thin film encapsulation, an edge seal and cathode seal may be applied at the time of scribing as previously described with respect to FIG. 7. In addition, edge seal materials may be fortified with fillers to improve water vapor and oxygen permeation properties.

Embodiments disclosed herein may be performed in various batch modes, such as where multiple devices are fabricated in a roll-to-roll, belt-driven, or similar process. For example, multiple OLED panels may be disposed on a common substrate and/or on a common substrate barrier layer, such that they are adjacent on the barrier as the panels are processed. A cut as previously disclosed that is made through the entire OLED panel may not extend through the substrate barrier, thus allowing for the barrier to be moved without disturbing or removing other OLED panels present on the barrier. More generally, the processes described herein with respect to example OLED panels may be performed in series, or partially or entirely concurrently, for multiple OLED panels.

Given the generally relatively high capital cost of OLED deposition equipment, it may be desirable for the time for cutting the OLED panel to an arbitrary shape is relatively short. As disclosed herein, fabricating an OLED panel of an arbitrary shape may include several processes: (a) laser removal of cathode material to define an active area border of a desired shape; (b) encapsulating a cut edge to protect organic layers; (c) cutting through a complete device including the substrate; (d) depositing metal ink or a similar material to provide external connections to the anode and cathode; (e) depositing metallic ink onto an exposed edge of a panel; and (f) heating of a sample edge to provide improved metal coverage. To reduce the total average cycle time of a fabrication process, it may be preferred for all of these processes to be carried out in only a single pass over the panel to be cut. For example, the various processes (a)-(f) may be performed in order using multiple fabrication components moved independently over the substrate, which each fabrication head operating in sequence.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

The invention claimed is:

1. A method of fabricating an organic light emitting device (OLED) panel having an arbitrary shape, the method comprising:

obtaining a first OLED panel comprising a plurality of layers, the layers including a substrate, an anode, a cathode, and an emissive organic stack;

making a first cut in the first OLED panel on a first shape outline, wherein the first cut does not extend through at least one layer of the first OLED panel; and making a second cut in the first OLED panel, wherein the second cut extends through each of the plurality of layers of the first OLED panel.

2. The method of claim 1, further comprising encapsulating the first OLED panel.

3. The method of claim 2, wherein the step of encapsulating the OLED panel is performed subsequent to the steps of making the first cut and making the second cut.

4. The method of claim 2, wherein the step of encapsulating the OLED panel is performed prior to the steps of making the first cut and making the second cut.

5. The method of claim 4, further comprising depositing a metal layer over an exposed edge of the OLED panel.

6. The method of claim 1, wherein the first cut forms a first externally-accessible electrical connection.

7. The method of claim 1, wherein the second cut is performed prior to the first cut.

8. The method of claim 1, wherein the first cut and the second cut are performed at least partially concurrently.

9. The method of claim 1, wherein the first cut extends through the cathode, but does not extend through at least a part of the emissive organic stack.

10. The method of claim 1, wherein the second cut defines an anode bus connection in the OLED panel.

11. The method of claim 1, further comprising:

obtaining a second OLED panel comprising a plurality of layers, the layers including a substrate, an anode, a cathode, and an emissive organic stack;

making a first cut in the second OLED panel on a second shape outline different than the first shape outline, wherein the second cut does not extend through at least one layer of the second OLED panel; and making a second cut in the second OLED panel, wherein the second cut extends through each of the plurality of layers of the second OLED panel.

12. The method of claim 11, wherein the first OLED panel and the second OLED panel are disposed on a common substrate.

13. The method of claim 11, wherein the first cut in the first OLED panel and the first cut in the second OLED panel are made with the same cutting mechanism.

14. The method of claim 1, wherein each of the first and second cuts is made with a laser ablation process.

15. The method of claim 1, further comprising sealing an edge of the OLED panel along the second cut.

16. The method of claim 1, wherein the substrate comprises a polymer cast on glass, the method further comprising, subsequent to making the first cut and the second cut, removing the polymer and the OLED from the glass to obtain a the OLED panel.

17. An OLED panel fabricated according to the method of claim 1.

* * * * *